(12) United States Patent  (10) Patent No.: US 7,888,781 B2
Galera et al.  (45) Date of Patent: Feb. 15, 2011

(54) MICRO-LAYERED LEAD FRAME SEMICONDUCTOR PACKAGES

(75) Inventors: Manolito Galera, Singapore (SG); Leocadio Morona Alabin, Singapore (SG)

(73) Assignee: Fairchild Semiconductor Corporation

( * ) Notice: Subject to any disclaimer, the term of this patent is extended or adjusted under 35 U.S.C. 154(b) by 160 days.

(21) Appl. No.: 12/199,065

(22) Filed: Aug. 27, 2008

(65) Prior Publication Data

US 2010/0052118 A1  Mar. 4, 2010

(51) Int. Cl.
*H01L 23/495* (2006.01)

(52) U.S. Cl. .............................. 257/666; 257/E23.031; 438/123

(58) Field of Classification Search ......... 257/666–677, 257/E23.004, E23.031–E23.059; 438/111, 438/112, 123, FOR. 367, FOR. 368, FOR. 377, 438/FOR. 380
See application file for complete search history.

(56) References Cited

U.S. PATENT DOCUMENTS 6,498,099 B1  12/2002  Mclellan et al.
6,635,957 B2  10/2003  Kwan et al.
7,129,116 B2  10/2006  Islam et al.
2006/0170081 A1*  8/2006  Gerber et al. ............... 257/666
2010/0013095 A1*  1/2010  Hada et al. .................. 257/741

OTHER PUBLICATIONS

U.S. Appl. No. 12/052,871, filed Mar. 21, 2008, Applicant Lim et al.

* cited by examiner

*Primary Examiner*—Jasmine J Clark
(74) *Attorney, Agent, or Firm*—Kirton & McConkie; Kenneth Horton (57) ABSTRACT

Semiconductor packages and methods for making and using the same are described. The semiconductor packages contain a lead frame with a customized array of lands at the bottom of the package. The lands are connected to a series of leads that are located within the perimeter of the lands. The leads can be routed according to the requirements of each specific IC die which they support and therefore can support both a single die and multiple die in the semiconductor package. Such a configuration provides a flexible routing for optimized layout, a maximized package density, and a higher input/output capability with a smaller package size. Other embodiments are also described.

20 Claims, 7 Drawing Sheets

MICRO-LAYERED LEAD FRAME SEMICONDUCTOR PACKAGES

FIELD

This application relates generally to semiconductor devices and methods for making such devices. More specifically, this application describes semiconductor packages that contain a lead frame with a customized array of lands and routing leads.

BACKGROUND

Semiconductor packages are well known in the art. Often, these packages may include one or more semiconductor devices, such as an integrated circuit ("IC") die or chip, which may be connected to a die pad that is centrally formed in a lead frame which contain a series of leads. In some cases, bond wires electrically connect the IC die to a series of terminals that serve as an electrical connection to an external device, such as a printed circuit board ("PCB"). An encapsulating material can be used to cover the bond wires, the IC die, the terminals, and/or other components of the semiconductor device to form the exterior of the semiconductor package. A portion of the terminals and possibly a portion of the die pad may be externally exposed from the encapsulating material. In this manner, the die may be protected from environmental hazards—such as moisture, contaminants, corrosion, and mechanical shock—while being electrically and mechanically connected to an intended device that is external to the semiconductor package.

After it has been formed, the semiconductor package is often used in an ever growing variety of electronic applications, such as disk drives, USB controllers, portable computer devices, cellular phones, and so forth. Depending on the die and the electronic application, the semiconductor package may be highly miniaturized and may need to be as small as possible.

SUMMARY

This application relates to semiconductor packages and methods for making and using the same. The semiconductor packages contain a lead frame with a customized array of lands at the bottom of the package. The lands are connected to a series of leads that are located within the perimeter of the lands. The leads can be routed according to the requirements of each specific IC die which they support and therefore can support both a single die and multiple die in the semiconductor package. Such a configuration provides a flexible routing for optimized layout, a maximized package density, and a higher input/output capability with a smaller package size.

BRIEF DESCRIPTION OF THE DRAWINGS

The following description can be better understood in light of the Figures, in which.

The Figures illustrate specific aspects of the semiconductor packages that contain multiple dies with discrete devices and methods for making such devices. Together with the following description, the Figures demonstrate and explain the principles of the methods and structures produced through these methods. In the drawings, the thickness of layers and regions are exaggerated for clarity. It will also be understood that when a layer, component, or substrate is referred to as being "on" another layer, component, or substrate, it can be directly on the other layer, component, or substrate, or intervening layers may also be present. The same reference numerals in different drawings represent the same element, and thus their descriptions will not be repeated.

DETAILED DESCRIPTION

The following description supplies specific details in order to provide a thorough understanding. Nevertheless, the skilled artisan would understand that the semiconductor devices and associated methods of using the devices can be implemented and used without employing these specific details. Indeed, the devices and associated methods can be placed into practice by modifying the illustrated devices and associated methods and can be used in conjunction with any other apparatus and techniques conventionally used in the industry. For example, while the description below focuses on methods for making for semiconductor devices in the IC industry, it could be used for and applied to other electronic devices like optoelectronic devices, solar cells, MEMS structures, lighting controls, power supplies, and amplifiers.

Some embodiments of the semiconductor packages and methods for making such packages are shown in the Figures. In these embodiments, the methods for making the semiconductor packages being by providing a lead frame 10. The lead frame 10 can be any lead frame known in the art. In some instances, the lead frame comprises a Cu or Cu alloy material that is manufactured by any known process, such as a stamping or etching process.

The lead frame can have any size and thickness that is needed for the complete semiconductor package. Thus, the size and thickness of the lead frame 10 will depend on the integrated circuit (IC) die or dies that will be contained in semiconductor package. The lead frame can comprise any conductive metal or metal alloy known in the art, including Cu, Ni—Pd, Ni—Pd—Au, Ni—Pd—Au/Ag, or combinations thereof. In some embodiments, the lead frame comprises Cu. In some embodiments, the lead frame is substantially rectangular with a size ranging from about 9,000 to about 20,000 mm$^2$ and a thickness ranging from about 0.15 to about 0.5 mm.

Figure 1:
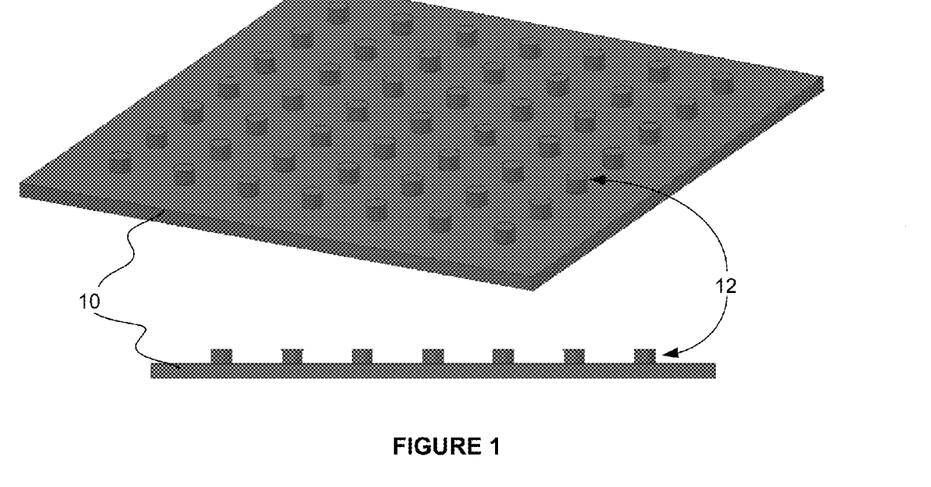
FIG. 1 shows some embodiments of a method for making semiconductor packages containing a lead frame with vias.

Next, vias 12 can be provided on the upper surface of the lead frame 10. The vias 12 can be formed on the lead frame 10 using any known technique in the art, including any known masking and etching process which removes the material of the lead frame 10 in the art where the vias 12 are not needed to be present. In some instances, the vias are formed while the lead frame 10 is being manufactured. The thickness of the vias 12 will depend on the leadframe thickness, and in some configurations can have half of its thickness. In some embodiments, the vias 12 can have a thickness ranging from about 75 μm to about 250 μm.

Figure 2:
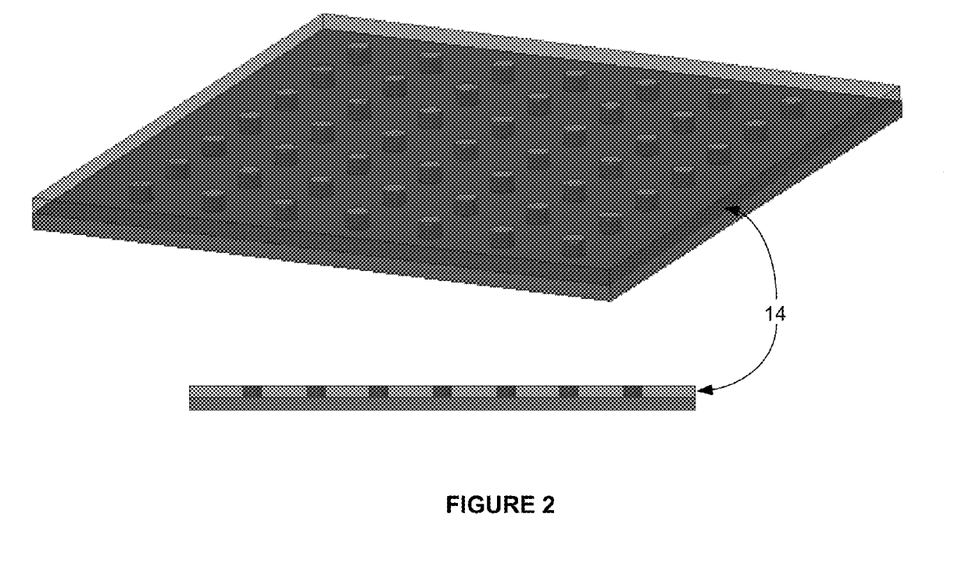
FIG. 2 depicts some embodiments of a method for making semiconductor packages containing exposed vias after pre-molding.

As shown in FIG. 2, a pre-molding layer 14 can then be provided on the lead frame 10 so that the upper surface of the vias 12 is exposed. The pre-molding layer 14 can be made of any material known in the art, such as an epoxy molding compound, a thermoset resin, a thermoplastic material, or a potting material. The pre-molding layer 14 can be provided in any manner known in the art. In some embodiments, such as where the pre-molding layer is made of potting material, it is deposited on the lead frame 10 by dispensing and then planarized by any physical action until the upper surface of the vias 12 are exposed.

Figure 3:
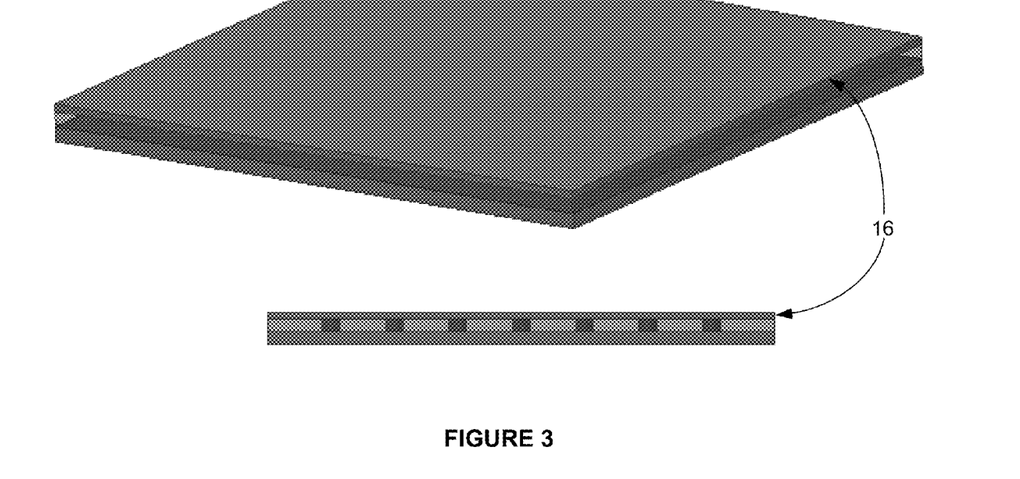
FIG. 3 shows some embodiments of a method for making semiconductor packages containing a metal cladding on the exposed vias.

As shown in FIG. 3, a metal cladding layer 16 can then be provided on the pre-molding layer 14 and the upper surface of the vias 12. In some embodiments, the metal cladding layer can have a piece of metal that can be configured with the desired size and then placed on the vias 12 using any known method, such as welding or bonding. The metal cladding layer 16 can comprise any conductive metal or metal alloy known in the art, including Cu, Ni—Pd, Ni—Pd—Au, Ni—Pd—Au/Ag, or combinations thereof. In some embodiments, the metal cladding layer comprises Cu. The metal cladding layer 16 can have any size and thickness that will be contained in semiconductor package. In some embodiments, the metal cladding layer can be substantially rectangular with a size ranging from about 9,000 to about 20,000 mm$^2$ and a thickness ranging from about 75 to about 250 μm.

Figure 4:
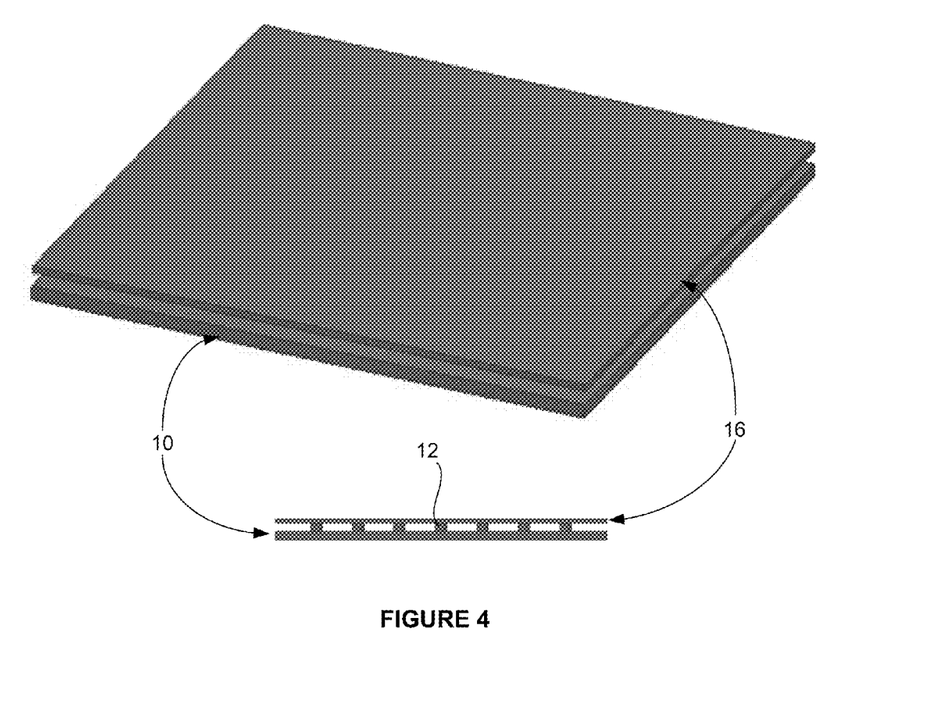
FIG. 4 depicts some embodiments of a method for making semiconductor packages containing a metal cladding on a lead frame with vias.
Figure 5:
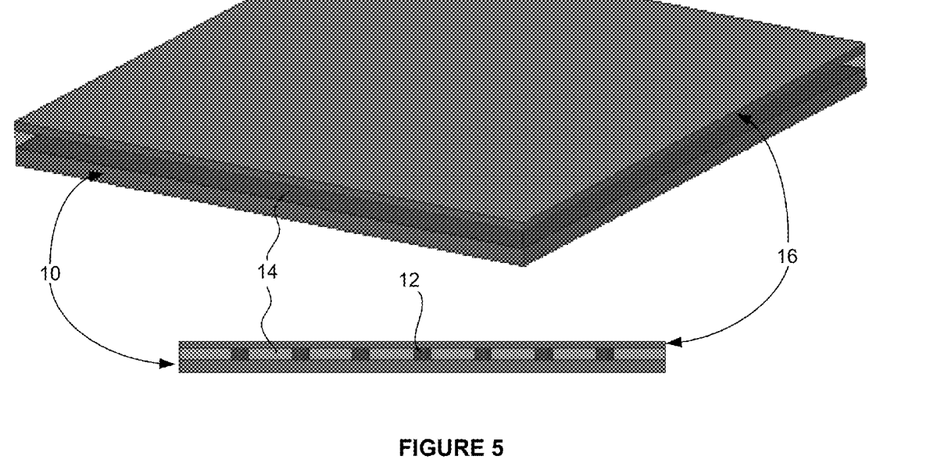
FIG. 5 shows some embodiments of a method for making semiconductor packages containing the structure of FIG. 4 with pre-molding.

In other embodiments, the structure depicted in FIG. 3 can be formed using another method. In these embodiments, the metal cladding layer 16 is first provided on the vias by welding or bonding as shown in FIG. 4. Then, as shown in FIG. 5, the pre-molding layer 14 is provided in the empty spaces between the lead frame 10, vias 12, and the metal cladding layer 16 by transfer molding.

Figure 6:
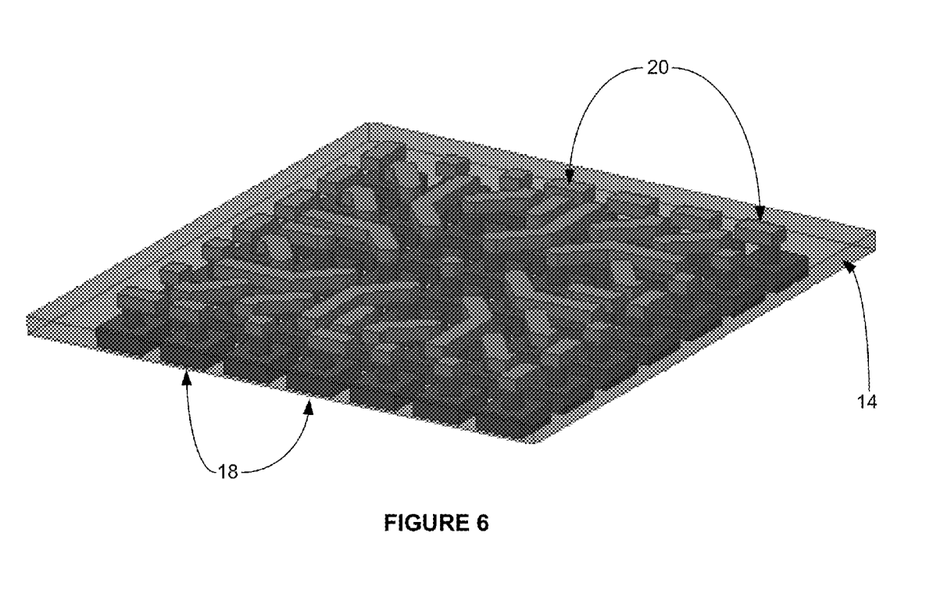
FIG. 6 shows some embodiments of a method for making semiconductor packages containing an etched metal cladding.

With the pre-molding layer 14 providing a structural stability and rigidity to the structure, the lead frame 10 and the metal cladding layer 16 are then etched. The lead frame 10 and metal cladding layer 16 can be etched in the same process or in separate processes. The lead frame 10 can be formed using any known process, such as any commonly used chemical etching. The result of this etching process includes the formation of lands 18 having an array that is configured for the external electronic device to which the semiconductor package will be attached (such as a printed circuit board), as shown in FIG. 6 (top view), FIG. 7 (bottom view), and FIG. 8 (without the pre-mold layer 14 shown).

The lands 18 can have any configuration known in the art consistent with their operation as terminals for the semiconductor package. Thus, in the illustrated embodiments, the lands 18 are given a substantially rectangular configuration with a size of about 0.35 mm$^2$. In other embodiments, though, lands 18 can have a round or other suitable geometrical shape in application and a size ranging from about 0.30 mm$^2$ to about 0.50 mm$^2$.

Figure 7:
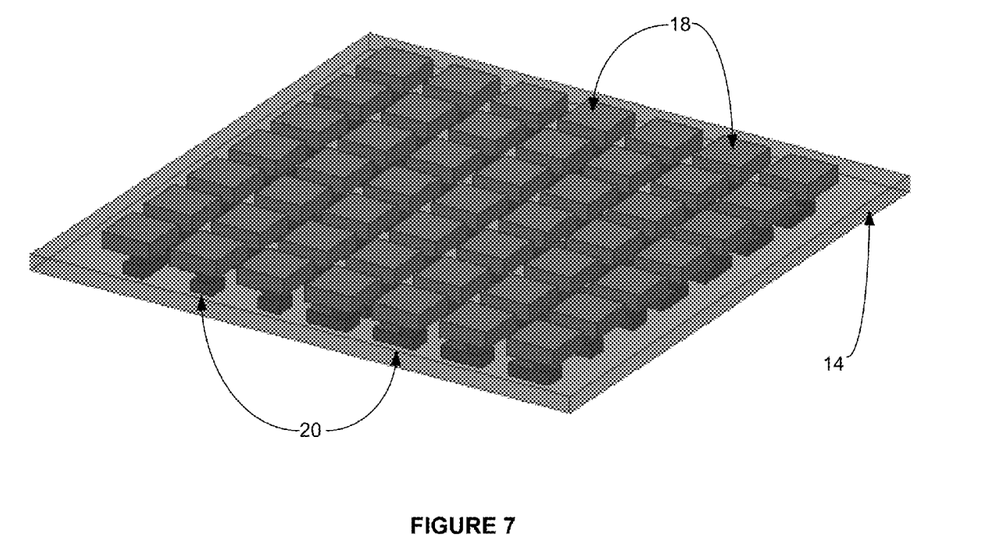
FIG. 7 depicts some embodiments of a method for making semiconductor packages containing an etched lead frame.
Figure 8:
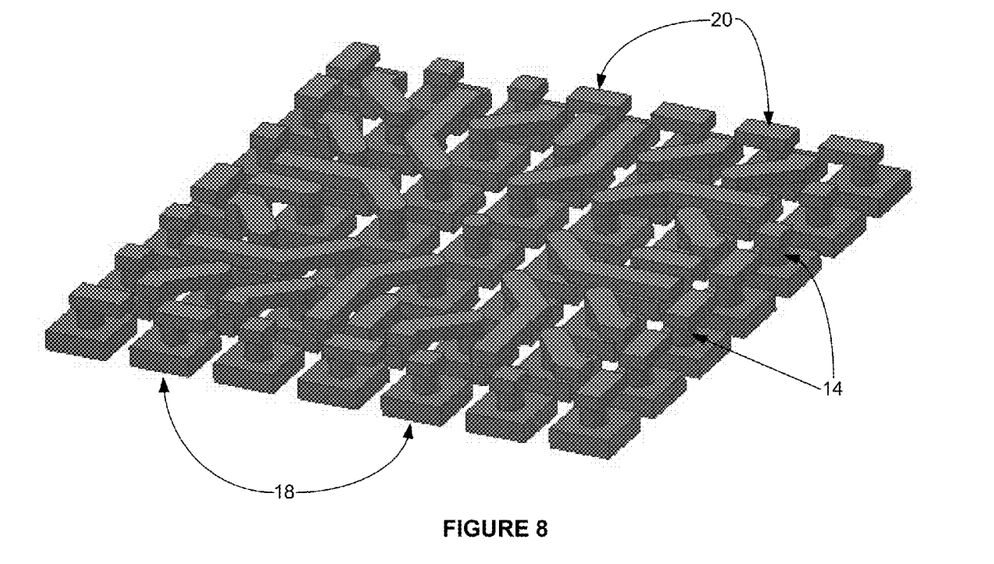
FIG. 8 shows some embodiments of a method for making semiconductor packages showing the structure of FIG. 7 without any pre-molding.

The metal cladding layer 16 can be formed using any known process, such as any commonly used chemical etching. The result of the etching process includes the formation of routing leads 20 which run from the vias 12 to the electrical connections of the IC die contains in the completed semiconductor package. As shown in FIGS. 6-8, the leads 20 run from the perimeter of the semiconductor package towards the interior of the semiconductor package. The leads 20 can be configured or customized to substantially match the desired connection points in the IC die that will be contained in the completed semiconductor package. Thus, for the semiconductor package that contains a high pin integrated circuit as illustrated in the Figures, the leads 20 are configured as a combination of lines and rectangles. Of course, other shapes can be used for the leads including substantially circular or any other known geometrical shapes.

Figure 9:
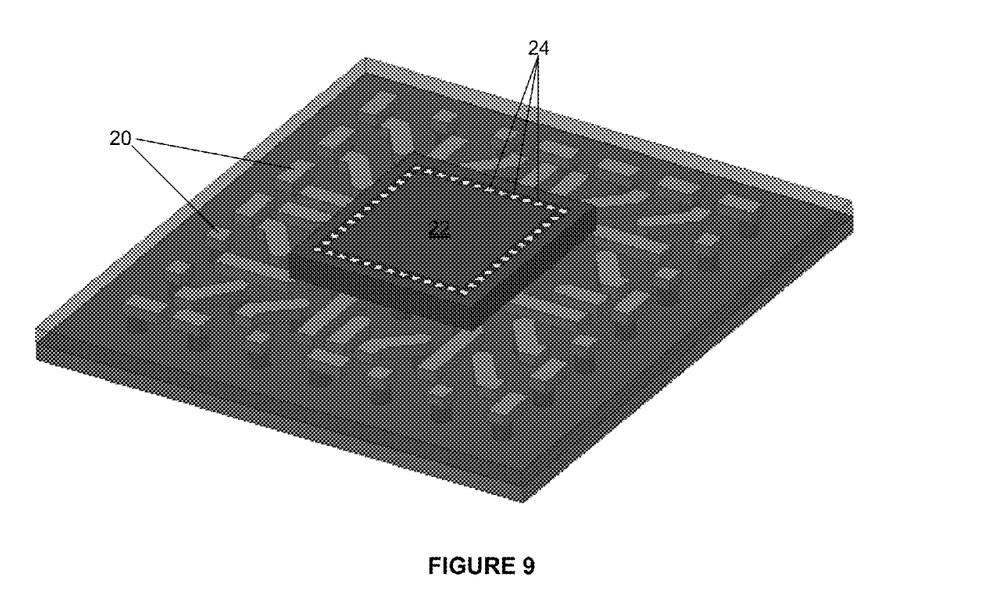
FIG. 9 depicts some embodiments of a method for making semiconductor packages showing the structure of FIG. 7 with a die attached.

Next, as shown in FIG. 9, a semiconductor die (or IC die) 22 is attached to the leads 20. The die 22 may be made of any suitable semiconductor material. Some non-limiting examples of such materials may include silicon, polysilicon, gallium arsenide, silicon carbide, gallium nitride, silicon and germanium, and the like.

The die 22 can contain any number of IC devices. The IC device may be any known integrated circuit (including any discrete device) in the art. Some non-limiting examples of these devices may include logic or digital IC, linear regulators, audio power amplifiers, LDO, driver IC, diodes, and/or transistors, including zener diodes, schottky diodes, small signal diodes, bipolar junction transistors ("BJT"), metal-oxide-semiconductor field-effect transistors ("MOSFET"), insulated-gate-bipolar transistors ("IGBT"), and insulated-gate field-effect transistors ("IGFET").

Figure 10:
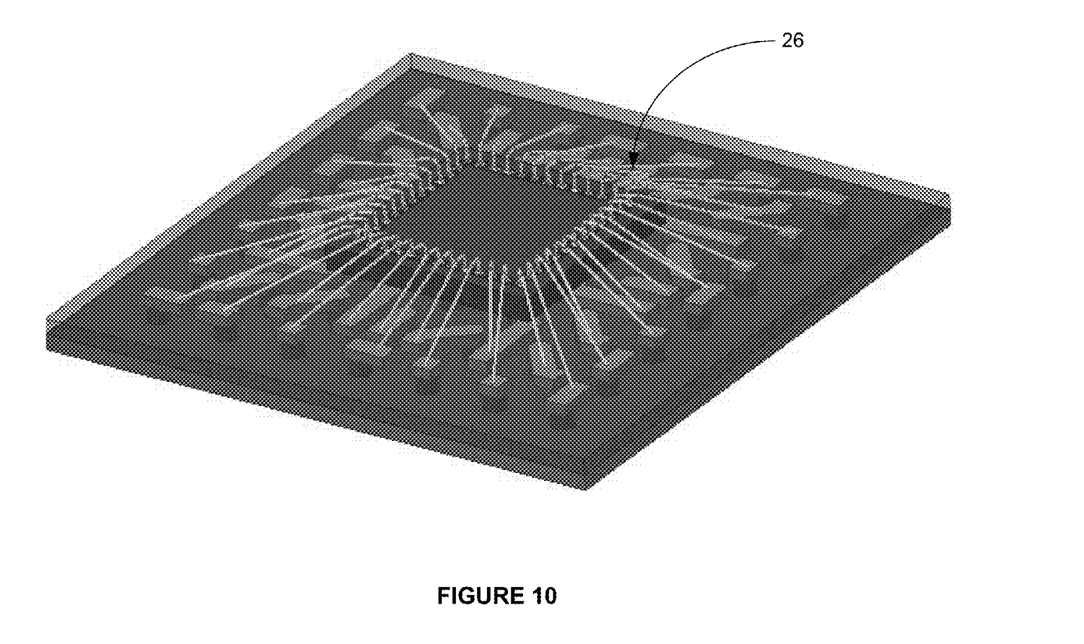
FIG. 10 depicts some embodiments of a method for making semiconductor packages showing the structure of FIG. 9 with wire bonds attached to the die and leadframe.

The die 22 can also comprise contact pads 24 available for electrical connection. Typically, those contact pads 24 are located in the periphery of the die, as illustrated in FIG. 9. Those contact pads can then be electrically connected to one or more of the leads 20 in any known manner. For example, FIG. 10 shows that the contact pads 24 can be electrically connected to the leads 20 by any known wire bonding process. In such instances, the bonding wire 26 may be made of any wire bonding material and have any suitable size. Some non-limiting examples of wire bonding materials may include Ag, Cu, and combinations thereof other. Where Au is used, the bonding wire may have a diameter from about 18 micrometers to about 50 micrometers. In some embodiments, with a change in the routing and layout configuration, a flip chip process can be used in place of the wire bonding process.

Figure 11:
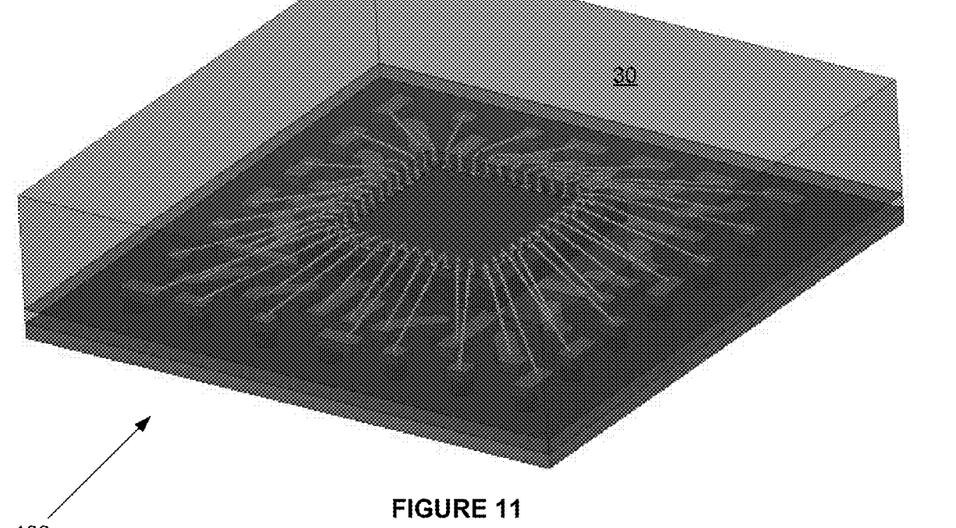
FIGS. 11-12 depicts a top and bottom view of some embodiments of an encapsulated semiconductor package.
Figure 12:
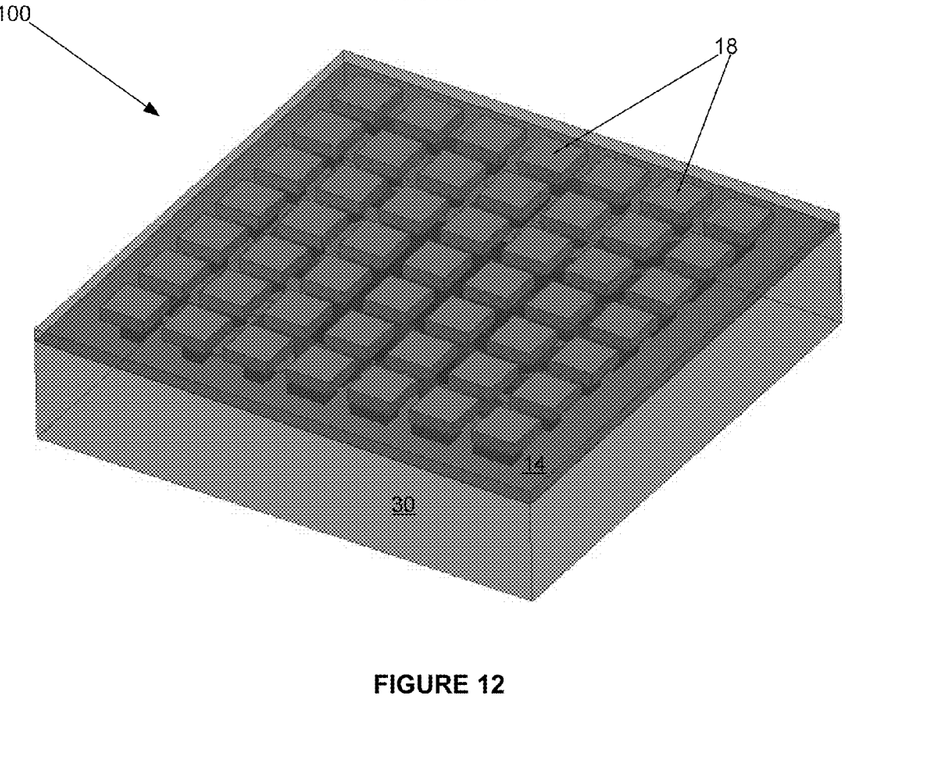

The vias 12, the leads 20, die 22 containing the contact pad(s) 24, and the bond wires 26 can then be encapsulated in any molding material 30 known in the art, as shown in FIGS. 11-12. In some embodiments, the molding material can comprise an epoxy molding compound, a thermoset resin, a thermoplastic material, or potting material. In other embodiments, the molding material comprises an epoxy molding compound. In FIGS. 11-12, the molding material 30 is shown in phantom to better illustrate the internal components of semiconductor package. The molding material made be formed using any encapsulation process known in the art. While the molding material 30 does not encapsulate the array of lands 18, the molding material 30 can cooperate with the pre-molding layer 14 to completely encapsulate the rest of the components of the semiconductor package. The resulting semiconductor package is then optionally marked and singulated using processes known in the art.

Figure 13:
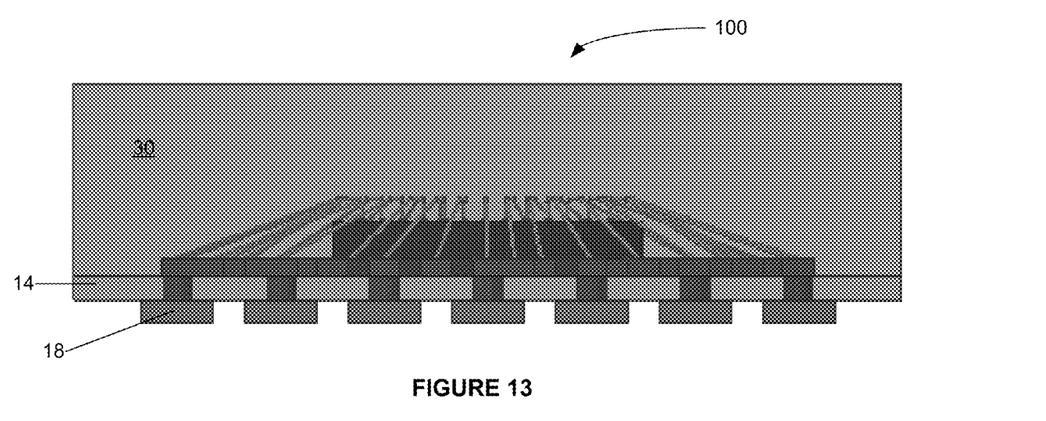
FIGS. 13-14 depicts a side and top view of some embodiments of an encapsulated semiconductor package.

The completed semiconductor package 100 is shown in the side view of FIG. 13. The package 100 contains both the pre-molding layer 14 and the molding material 30 that together encapsulate the package 100. The lands 18 remain exposed and are configured in a stand-off position so that they can be attached to the PCB or other external device. The vias 12 and the bond wires 26 operate to route the electrical signals from the IC device in die to the PCB.

Figure 14:
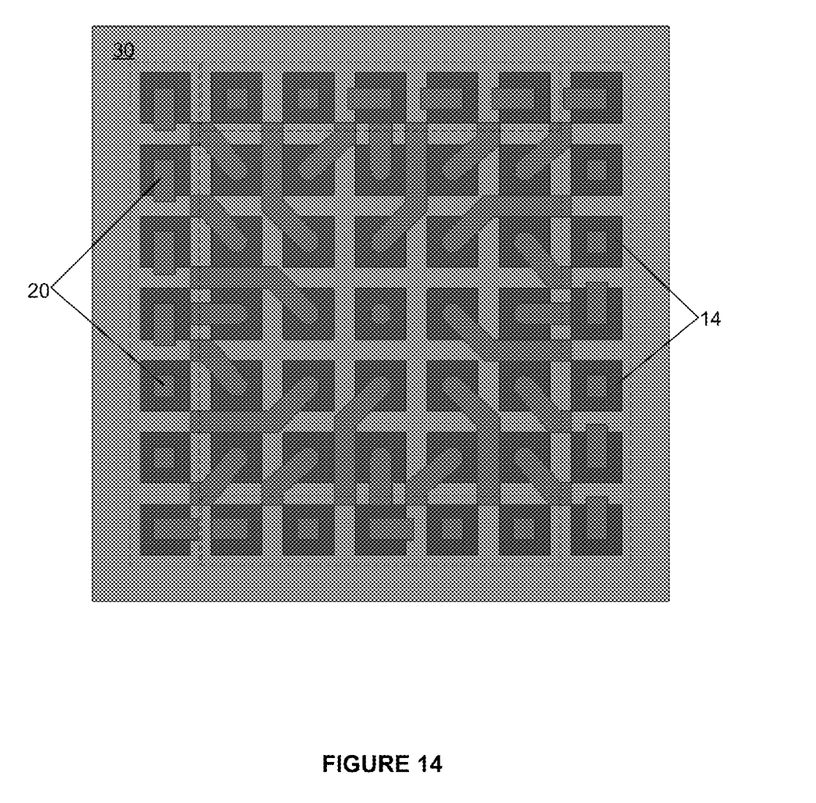

The details of the lead configuration is shown in FIG. 14 (without the die and bond wires). The leads 20 can be routed and customized for a wide variety of land configurations. This allows the semiconductor package to be configured with many different sizes and shapes. At the same time, the leads 20 can be customized for different sizes of dies and different IC devices contained in the dies.

Indeed, in some embodiments, the semiconductor package 100 can be configured to contain more than a single die. In these embodiments, the periphery of the device (i.e., the areas contained within the dotted lines of FIG. 14) can be used for additional lands that can be used to contain additional leads that would be connected to a second die that is located over the first die in a stacked die configuration.

These semiconductor packages have a higher input/output (I/O) capability with a smaller package size when compared to conventional semiconductor packages. The actual package density will depend on the integrated circuit and package body size. They also contain a flexible routing for optimal bonding layout and are able to avoid long bond wire lengths through optimized routing. They have a lower cost than packages containing a bismaleimide triazine (BT) substrate with a universal base lead frame design because of lower base material (Cu) and leadframe manufacturing cost. These semiconductor packages have a thickness ranging from about 0.5 mm to about 1 mm, which is thinner that ball grid array (BGA) semiconductor packages. The processes used to form these semiconductor packages also result in a longer blade life because during the package singulation, there is no metal to metal contact by the saw blade to the singulated package.

In addition to any previously indicated modification, numerous other variations and alternative arrangements may be devised by those skilled in the art without departing from the spirit and scope of this description, and appended claims are intended to cover such modifications and arrangements. Thus, while the information has been described above with particularity and detail in connection with what is presently deemed to be the most practical and preferred aspects, it will be apparent to those of ordinary skill in the art that numerous modifications, including, but not limited to, form, function, manner of operation and use may be made without departing from the principles and concepts set forth herein. Also, as used herein, examples are meant to be illustrative only and should not be construed to be limiting in any manner.

The invention claimed is:

1. A semiconductor package, comprising:
   a lead frame comprising an array of lands which are not physically connected to each other;
   an array of vias connecting the array of lands to an array of leads;
   a die containing an integrated circuit resting on a first portion of the lead array and electrically connected to a second portion of the lead array by wire bonds; and
   a molding material encapsulating the vias, the leads, the die, and the wire bonds.

2. The semiconductor package of claim 1, wherein the vias are formed in the lead frame by etching and can be used for different package sizes.

3. The semiconductor package of claim 1, wherein the array of lands comprise terminals for the package.

4. The semiconductor package of claim 3, wherein the leads are located within the perimeter of the terminals.

5. The semiconductor package of claim 1, wherein the package is a flat package containing no external leads and the lands are located at the bottom of the package.

6. The semiconductor package of claim 1, wherein the molding material comprises a first portion encapsulating the vias and a second portion encapsulating the leads, the die, and the wire bonds.

7. The semiconductor package of claim 6, wherein the first portion of the molding material and the second portion of the molding material are formed separately.

8. The semiconductor package of claim 1, wherein the die is electrically connected to the second portion of the lead array by wire bonds.

9. A method for making semiconductor package, comprising:
   providing a lead frame comprising an array of lands which are not physically connected to each other;
   providing an array of vias connecting the array of lands to an array of leads;
   providing a die containing an integrated circuit resting on a first portion of the lead array and electrically connected to a second portion of the lead array; and
   providing a molding material encapsulating the vias, the leads, the die, and the wire bonds.

10. The method of claim 9, wherein the molding material comprises a first portion encapsulating the vias and a second portion encapsulating the leads, the die, and the wire bonds.

11. The method of claim 10, wherein the first portion of the molding material and the second portion of the molding material are formed separately.

12. The method of claim 9, including forming the array of lands by etching the lead frame so that each land is physically separated from any adjacent land.

13. The method of claim 10, including forming the array of leads by providing a metal cladding layer on the arrays and then etching the metal cladding layer.

14. The method of claim 9, including attaching the bottom surface of the die to the first portion of the lead array and then wire bonding the second portion of the array to contact pads on the upper surface of the die.

15. A method for making semiconductor package, comprising:
   providing a lead frame containing an array of vias;
   providing a pre-mold layer around the vias and a metal cladding layer on the upper surfaces of the vias;
   etching the metal cladding layer to provide a series of leads;
   etching the lead frame to form an array of lands which are not physically connected to each other;
   attaching a die containing an integrated circuit device to a first portion of the leads;
   electrically connecting a second portion of the leads and the integrated circuit device; and
   encapsulating the leads, the die, and the wire bonds with a molding material.

16. The method of claim 15, wherein the vias are formed by etching an upper surface of the lead frame.

17. The method of claim 15, including providing bond wires to electrically connect the second portion of the leads and the integrated circuit device.

18. The method of claim 15, wherein the pre-mold layer provides a structural rigidity during the processes of etching the lead frame to form the lands and etching the metal cladding layer to form the leads.

19. The method of claim 15, including attaching the bottom surface of the die to the first portion of the lead array and then wire bonding the second portion of the array to contact pads on the upper surface of the die.

20. The method of claim 15, wherein the lands remain exposed after the encapsulation.

* * * * *